(12) United States Patent
Suzuki et al.

(10) Patent No.: US 8,441,065 B2
(45) Date of Patent: May 14, 2013

(54) SEMICONDUCTOR DEVICE AND MANUFACTURING METHOD OF THE SAME

(75) Inventors: Hirokatsu Suzuki, Tokyo (JP); Atsushi Fujiki, Tokyo (JP); Yoshito Nakazawa, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/851,101

(22) Filed: Aug. 5, 2010

(65) Prior Publication Data

US 2010/0315751 A1      Dec. 16, 2010

Related U.S. Application Data

(63) Continuation of application No. 11/610,704, filed on Dec. 14, 2006, now abandoned.

(30) Foreign Application Priority Data

Dec. 16, 2005 (JP) ................................. 2005-363815

(51) Int. Cl.
  *H01L 29/76* (2006.01)
(52) U.S. Cl.
  USPC ....... 257/330; 257/355; 257/360; 257/E29.26
(58) Field of Classification Search .................. 257/330, 257/341, 355–358, 360, E29.255, E29.26
  See application file for complete search history.

(56) References Cited

U.S. PATENT DOCUMENTS

| | | | | |
|---|---|---|---|---|
| 5,539,610 A | * | 7/1996 | Williams et al. | 361/246 |
| 5,903,034 A | * | 5/1999 | Sakamoto et al. | 257/379 |
| 6,211,549 B1 | * | 4/2001 | Funaki et al. | 257/329 |
| 6,323,518 B1 | * | 11/2001 | Sakamoto et al. | 257/330 |
| 6,369,446 B1 | * | 4/2002 | Tanaka | 257/758 |
| 6,373,671 B1 | * | 4/2002 | Watanabe et al. | 361/93.8 |
| 6,844,578 B2 | | 1/2005 | Harada et al. | |
| 2005/0286194 A1 | * | 12/2005 | Fujiki et al. | 361/100 |

FOREIGN PATENT DOCUMENTS

| | | |
|---|---|---|
| JP | 63-229758 | 9/1988 |
| JP | 04-280467 A | 10/1992 |
| JP | 9-155784 | 6/1997 |
| JP | 2000-91344 A | 3/2000 |
| JP | 2002-313945 A | 10/2002 |
| JP | 2002-359294 A | 12/2002 |

OTHER PUBLICATIONS

Notification of Reasons for Refusal of Japanese application 2005-363815 by JPO, dated Mar. 13, 2012, with English translation.

* cited by examiner

*Primary Examiner* — Tuan N. Quach
(74) *Attorney, Agent, or Firm* — Mattingly & Malur, PC

(57) ABSTRACT

A semiconductor device which combines reliability and the guarantee of electrical characteristics is provided. A power MOSFET and a protection circuit formed over the same semiconductor substrate are provided. The power MOSFET is a trench gate vertical type P-channel MOSFET and the conduction type of the gate electrode is assumed to be P-type. The protection circuit includes a planar gate horizontal type offset P-channel MOSFET and the conduction type of the gate electrode is assumed to be N-type. These gate electrode and gate electrode are formed in separate steps.

13 Claims, 19 Drawing Sheets

HIGH SIDE SWITCH
CONSISTS OF Nch
(WITH A STEP-UP CIRCUIT)

HIGH SIDE SWITCH
CONSISTS OF Pch
(WITHOUT A STEP-UP CIRCUIT)

SEMICONDUCTOR DEVICE AND MANUFACTURING METHOD OF THE SAME

CROSS-REFERENCE TO RELATED APPLICATIONS

This is a continuation application of U.S. Ser. No. 11/610,704, filed Dec. 14, 2006, now abandoned, the contents of which are hereby incorporated by reference into this application.

The present application claims priority from Japanese patent application No. 2005-363815 filed on Dec. 16, 2005 the content of which is hereby incorporated by reference into this application.

BACKGROUND OF THE INVENTION

The present invention relates to a semiconductor device and a manufacturing method thereof, specifically relates to an effective technology for applying a semiconductor device where a trench gate MOSFET (Metal Oxide Semiconductor Field Effect Transistor) and a planar gate MOSFET are formed over the same semiconductor substrate.

For instance, in an electronic control unit for automobiles, a semiconductor device where a power MOSFET and a protection circuit (protection element) thereof are combined in one unit is applied for the purpose of making it smaller and highly reliable in a high temperature environment.

Japanese unexamined Patent Publication No. Show 63 (1988)-229758 (patent document 1) discloses a technology relating to a vertical type power MOS transistor having a self overheat protection function.

Japanese Patent No. 3414569 (Patent document 2) discloses a technology relating to a trench insulator gate (trench gate type) semiconductor element and horizontal type insulator gate (planar gate type) semiconductor element formed over the same chip.

[Patent document 1] Japanese Unexamined Patent Publication No. Show 63 (1988)-229758
[Patent document 2] Japanese Patent No. 3414569

SUMMARY OF THE INVENTION

A semiconductor device where a power MOSFET which is applied to the load side of electronic parts, etc. as a switching element and a protection circuit thereof are combined in one unit makes it possible to integrate electronic parts and reduce the manufacturing cost by formation over the same semiconductor substrate (integration) compared with structures where a power MOSFET and a protection circuit are formed separately. Herein, a protection circuit is a circuit for protecting a power MOSFET, for instance, it is a temperature detection overheat cutoff circuit, etc.

For instance, it is assumed that grounding (short-circuit) occurs in the case when a P-channel power MOSFET is applied to a high side switch for automobiles as shown in FIG. 17. In the case when no protection is applied to the power MOSFET, a large current flows momentarily, resulting in the power MOSFET being broken. Therefore, maintenance such as exchanging an electronic control unit (board) where the power MOSFET is mounted becomes necessary. Then, by using a protection circuit, it is thought that the power MOSFET is prevented from ground breakdown. (short-circuit breakdown).

Herein, there are two methods, one is a method where a protection circuit and a power MOSFET are constructed separately (the protection circuit is not built in the power MOSFET) and another is a method where a protection circuit is built in a power MOSFET itself. However, because of a reduction in the number of parts, cost reduction, and ease in handling, a power MOSFET where a protection circuit is built-in (power MOSFET with a built-in protection circuit) is effective. Specifically, in the above-mentioned fields where high reliability is required, such as in the aforementioned automobiles and industrial equipment, a power MOSFET with a built-in protection circuit is effective. Moreover, since a power MOSFET and a protection circuit are formed by applying a semiconductor processing technique, a protection circuit can be built in a power MOSFET over the same semiconductor substrate.

Thus, integration of electronic parts can be achieved and manufacturing costs can be reduced by forming a power MOSFET and a protection circuit over the same semiconductor substrate. As a semiconductor device which includes a power MOSFET and a protection circuit formed over the same semiconductor substrate (power MOSFET with build-in protection circuit), for instance, a planar gate type N-channel vertical type MOSFET which is a planar gate is utilized as a power MOSFET, and a planar gate type N-channel horizontal type normal MOSFET which is a planar gate is utilized as a protection circuit in the aforementioned patent document 1. Herein, normal means that it is not an offset drain structure to be described later.

In general, a low on resistance is demanded in order to suppress the loss (heat) while switching to the aforementioned power MOSFET. A decrease in the resistivity of the power MOSFET can be designed by assuming the gate to be not a planar structure but a trench structure. Since the trench gate is formed by burying a conductive film in the groove through the gate insulator film, a gate insulator film with high quality and high reliability is necessary in order to maintain the gate breakdown voltage and decrease gate leakage.

As a semiconductor device which includes a trench gate power MOSFET and a protection circuit formed over the same semiconductor substrate, for instance, a trench gate vertical type N-channel MOSFET is applied to the power MOSFET and a planar gate horizontal type offset N-channel MOSFET is applied as the protection circuit in the aforementioned patent document 2. Herein, in the present invention, offset means a structure which can maintain a high breakdown voltage at, for instance, a shallow region (semiconductor region) which is about several microns from the surface of the semiconductor substrate. Moreover, the structure where only the drain side has an offset structure is called an offset drain structure.

For instance, in the case of a semiconductor device which includes a trench MOSFET and an offset MOSFET as shown in FIG. 18, the input voltage from the gate is applied to the gate of the trench MOSFET and the drain of the offset MOSFET. In addition, as mentioned above, in order to maintain the gate insulator film with high quality and high reliability, voltage screening is performed in order to remove initial faults in the gate insulator film. Therefore, a screening voltage is applied to the drain in the offset MOSFET during voltage screening, so that an offset drain structure is required which has a breakdown voltage higher than at least the screening voltage.

By the way, the power MOSFETs are applied to the load side of electronic parts in automobiles, and the power MOSFET includes a high side switch and a low side switch according to the car body ground conditions of the battery. In the case when the high side switch circuit includes an N-channel MOSFET (FIG. 19A), a step-up circuit (charge pump) is necessary for the gate drive. On the other hand, in the case when it includes a P-channel MOSFET (FIG. 19B), a step-up circuit is not necessary. Therefore, as shown in FIG. 20, the packing substrate area can be reduced to about ⅓ when the high side switch includes a P-channel MOSFET compared with the case when the high side switch includes an N-channel MOSFET. That is, in the case when a P-channel power MOSFET is used for the high side switch, the packing substrate area can be reduced because a step-up circuit is not necessary.

As a P-channel power MOSFET constituting such a high side switch circuit, for instance, since it is thought that a power MOSFET having a protection circuit formed over the same semiconductor substrate (power MOSFET with a built-in protection circuit) can be applied, the inventors examined this point. Although the aforementioned patent document 1 and patent document 2 describe a semiconductor device which includes a power MOSFET and a protection circuit formed over the same semiconductor substrate, there is no description of a P-channel power MOSFET including a high side switch circuit.

It is assumed that a semiconductor device including a power MOSFET and a protection circuit formed over the same semiconductor substrate which was investigated by the inventors uses a trench gate vertical type P-channel MOSFET for a power MOSFET and uses a planar gate horizontal type offset P-channel MOSFET for a protection circuit. Herein, in order to simplify the manufacturing process, the trench gate MOSFET and the planar gate MOSFET were formed in one step. Therefore, for instance, each gate electrode is formed of arsenic (As) or phosphorus (P) doped polycrystalline silicon, resulting in their becoming the same conduction type (N-type).

On the other hand, in the power MOSFET with a built-in protection circuit, a low on resistance is required for the power MOSFET, and low characteristic fluctuation is required for the planar MOSFET in order to prevent malfunctions.

In the case when the gate electrode of the P-channel MOSFET is made to be N-type, Vth becomes about 1 V deeper than that of a P-type because of the difference in the work functions. However, the characteristic fluctuation becomes smaller due to bias stress.

Therefore, in a trench P-channel MOSFET and an offset P-channel MOSFET examined by the inventors, the characteristic fluctuation of the offset P-channel MOSFET can be reduced when both gate electrodes are made to be N-type. However, the Vth of the trench P-channel MOSFET becomes deeper, so that a problem arises that the "on" resistance increases under the condition where a sufficient gate voltage is not provided.

Thus, a method for forming the channel layer (N-type layer) of the P-channel MOSFET and the impurity layer of the opposite conduction type (P-type) is generally known as a technology to control the Vth at the shallower side. However, when this method is applied, it is necessary to keep a sufficient effective channel length. Because if this impurity layer is formed in the condition where the effective channel length is short, punchthrough occurs easily and the breakdown voltage is reduced. In the case of the offset P-channel MOSFET, it is possible to make the Vth shallower while preventing the punchthrough if the effective channel length is controlled to be, for instance, 4 µm or more. However, in the power MOSFET, the channel resistance increases and the "on" resistance increases when the effective channel length is made longer. Therefore, a device in which punchthrough does not occur and the "on" resistance is low is extremely difficult to make.

On the other hand, in a trench P-channel MOSFET and an offset P-channel MOSFET examined by the inventors, the Vth of the trench P-channel MOSFET becomes shallower when both gate electrodes are made to be P-type. However, a problem arises where the characteristic fluctuation of the offset P-channel MOSFET becomes greater due to NBT (negative bias temperature).

Although the aforementioned patent document 1 and patent document 2 describes a semiconductor device which includes a power MOSFET and a protection circuit formed over the same semiconductor substrate, there is no description of the problem where the Vth of the power MOSFET increases when it is made to be an N-type gate and the characteristic fluctuation of the MOSFET of the protection circuit becomes greater when it is made to be a p-type gate. Moreover, the gate of the power MOSFET and the gate of the MOSFET of the protection circuit are examined only in the case when both conduction types are the same.

In the case when a trench P-channel MOSFET and an offset P-channel MOSFET (protection circuit) are simply combined, problems with the thickness of the gate insulator film and the thickness of the gate electrode arise in addition to the aforementioned problem of the conduction type of the gate.

The problem of the thickness of the gate insulator film is that the thickness of the gate insulator film of the offset MOSFET becomes thicker when the gate insulator film is made thicker in order to maintain the gate breakdown voltage of the p-channel MOSFET. Therefore, the threshold voltage Vth of the P-channel offset MOSFET has to be controlled by the well concentration. Moreover, when an attempt is made to lower the well concentration to decrease the threshold voltage Vth of the P-channel offset MOSFET, the variation of the threshold voltage Vth becomes greater.

The problem of the thickness of the gate electrode is that thick polycrystalline silicon films have to be stacked for burying the trench of the trench MOSFET and the gate electrode of the offset MOSFET also has to be formed of a thick polycrystalline silicon film. Therefore, the machining accuracy becomes worse, resulting in the variation of the threshold voltage Vth of the offset MOS becoming greater.

It is an objective of the present invention to provide a highly reliable MOSFET with a built-in protection circuit.

Moreover, it is a further objective of the present invention to provide a MOSFET with a built-in protection circuit having excellent electrical characteristics.

The aforementioned and other objectives and new features of the present invention will become apparent from the following descriptions with reference to the accompanying drawings of this specification.

BRIEF DESCRIPTION OF THE DRAWINGS

FIGS. 2A and 2B are schematic explanatory drawings illustrating a semiconductor device in a power MOS region in the embodiment, in which FIG. 2A is a plane drawing and FIG. 2B a cross-sectional drawing;

FIGS. 3A and 3B are schematic explanatory drawings illustrating a semiconductor device in a protection circuit region in the embodiment, in which FIG. 3A is a plane drawing and FIG. 3B a cross-sectional drawing;

FIGS. 19A and 19B are circuit drawings, in which FIG. 19A is one constituting a low side switch and FIG. 19B is one constituting a high side switch; and FIGS. 20A and 20B are schematic plane drawings illustrating a semiconductor device constituting a high side switch, in which FIG. 20A is the case constituted by an N-channel MOS and FIG. 20B is the case constituted by a P-channel MOS.

DETAILED DESCRIPTION OF THE PREFERRED EMBODIMENTS

The outline of a typical one disclosed in the present invention will be simply described as follows.

The semiconductor device of the present invention includes a power MOSFET and a protection circuit formed over the same semiconductor substrate, in which the power MOSFET is a trench gate vertical-type P-channel MOSFET and the protection circuit is a planar gate horizontal-type P-channel MOSFET. The conductivity of the gate electrode of this trench gate vertical-type P-channel MOSFET is P-type and the conductivity of the gate electrode of the planar gate horizontal-type offset P-channel MOSFET is N-type.

The effects obtained by a typical one disclosed in the present invention will be simply described as follows.

According to a semiconductor device of the present invention, a MOSFET with a built-in protection circuit can be supplied which secures both reliability and electrical characteristics.

Before explaining the embodiments of the present invention, terms in the present invention will be defined, especially in the case where there are no explanations. "MOS" is an abbreviation of MOSFET (Metal Oxide semiconductor Field Effect Transistor); "vertical type" is a structure where the current between source and drain flows in the thickness direction of the semiconductor substrate; "horizontal" is a structure where the current between source and drain flows perpendicular to the thickness direction of the semiconductor substrate. Moreover, "trench (trench gate)" will be described later and is a structure where a gate electrode is formed in a groove formed in the thickness direction of the semiconductor substrate, and "planar (planar gate)" is a structure where a gate electrode is formed on the main face of the semiconductor substrate. Furthermore, "offset" is a structure which maintains a high breakdown voltage at, for instance, a shallow region (semiconductor region) which is about several microns from the surface of the semiconductor substrate.

Hereinafter, the embodiments of this invention are described in detail on the basis of the drawings as follows. In all the figures to describe the embodiment, the same reference letters are affixed to the same material as a rule, and repetitive explanations are omitted.

A semiconductor device described in the embodiment of the present invention includes a power MOSFET and a protection circuit. This power MOSFET is a P-channel trench gate vertical-type MOSFET (hereinafter, it is called a trench PMOS) and the protection circuit is a P-channel planar gate horizontal-type offset MOSFET (hereinafter, it is called an offset PMOS). Specifically, this protection circuit is a control circuit which is intended to let the trench PMOS not self-destruct and it includes an offset PMOS.

Figure 1:
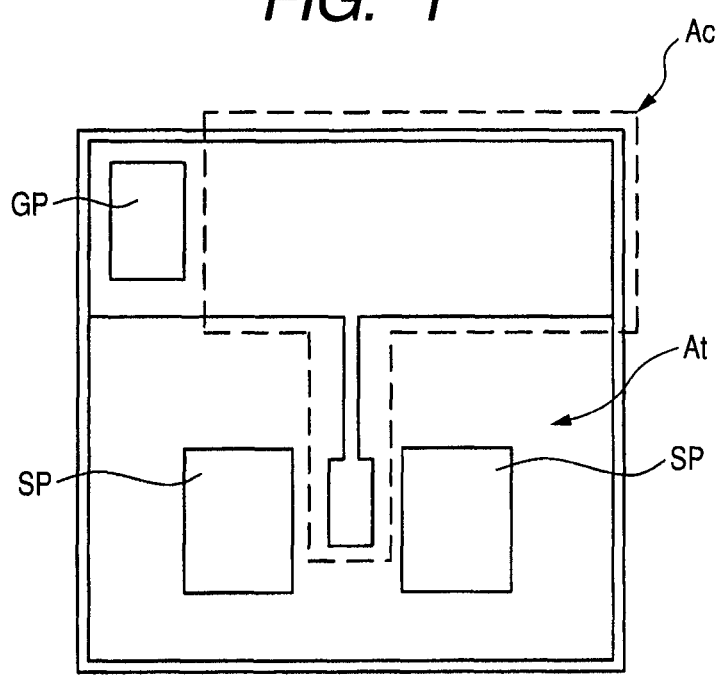
FIG. 1 is a schematic plane drawing illustrating a semiconductor device with a layout of the chip in the embodiment of the present invention.
Figure 2A:
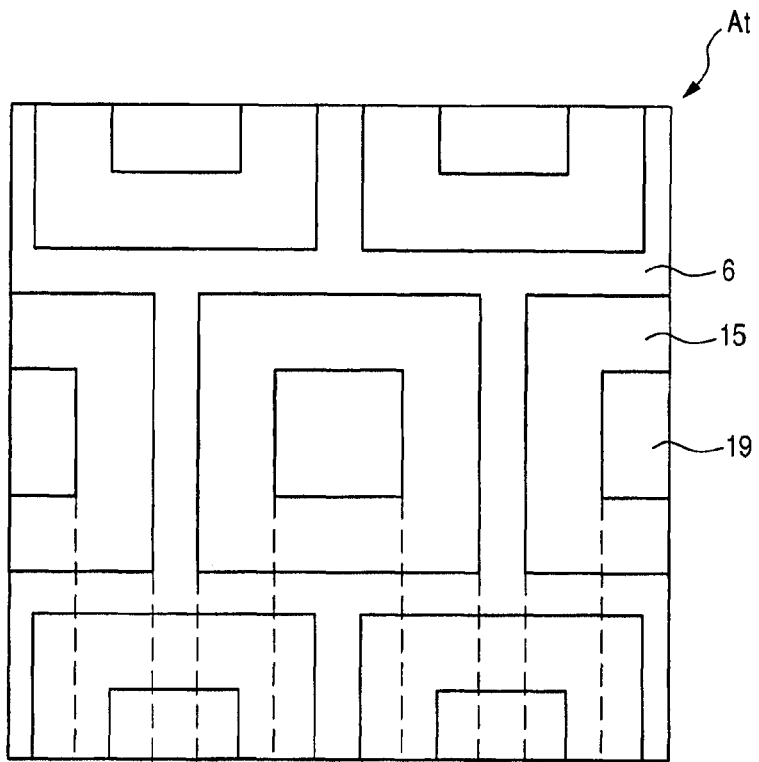
Figure 2B:
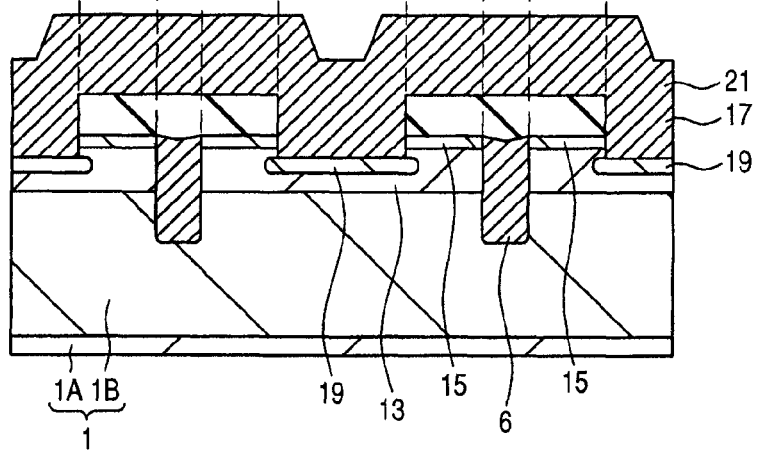
Figure 3A:
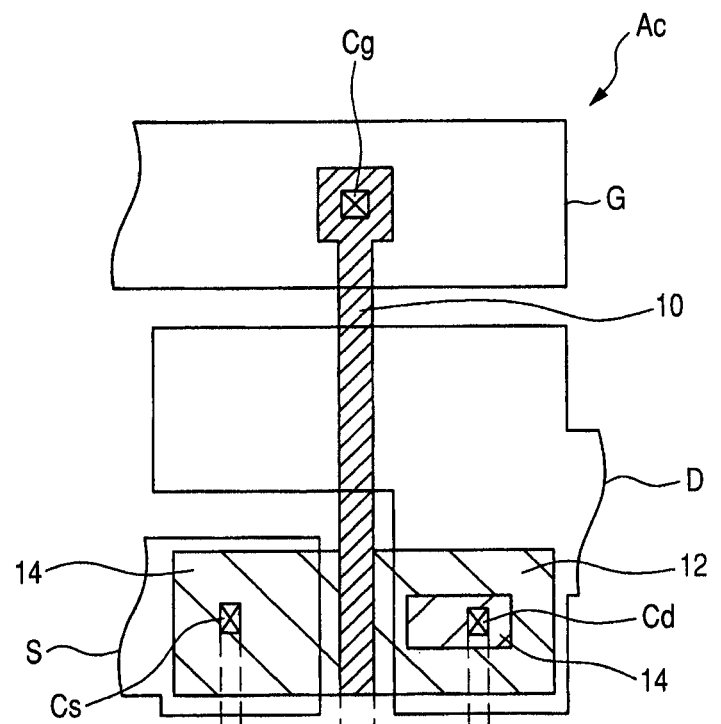
Figure 3B:
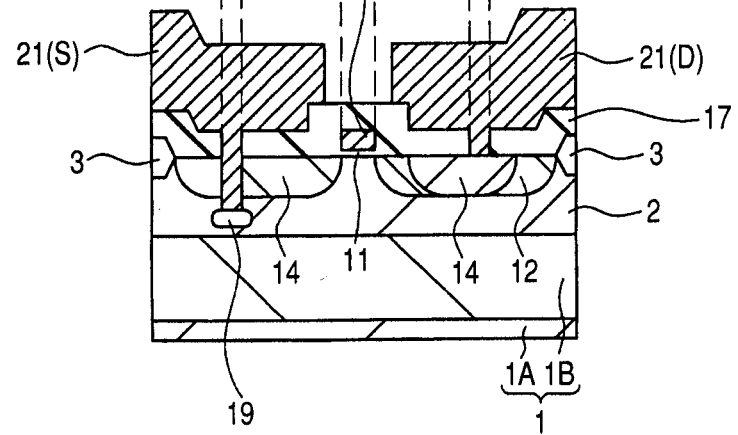

FIG. 1 is a schematic plane drawing illustrating a semiconductor device in a chip state in which a trench PMOS and an offset PMOS are provided. FIGS. 2A and 2B are schematic explanatory drawings illustrating the trench PMOS of FIG. 1, in which FIG. 2A is a main part plane drawing and FIG. 2B is a main part cross-sectional drawing. FIGS. 3A and 3B are schematic explanatory drawings illustrating the offset PMOS of FIG. 1, in which FIG. 3A is a main part plane drawing and FIG. 3B is a main part cross-sectional drawing. In FIG. 2A, in order to make the cell structure of the trench PMOS easy to understand, the interconnect layer 21 shown in FIG. 2B is omitted.

The trench PMOS region, At, and the protection circuit region (offset PMOS region), Ac, are shown in FIG. 1. As external terminals, a gate pad (gate electrode) of the trench PMOS and a source pad (source electrode) of the trench PMOS are arranged at the chip surface; a drain electrode of the trench PMOS is arranged at the chip rear surface; and the protection circuit has no external terminal. That is, the protection circuit (offset PMOS) is built into the trench PMOS.

These trench PMOS and protection circuits (offset PMOS) are formed on one chip, and, as shown in FIG. 2 and FIG. 3, the trench PMOS and the offset PMOS are formed on the main surface of the same semiconductor substrate 1. This semiconductor substrate 1 is a substrate where P+ type single crystalline silicon 1B in which an impurity having P-type conduction type is doped is epitaxially grown on the main face of a P++ type single crystalline silicon substrate 1A having P-type conduction type (hereinafter, it is simply called a substrate).

In the trench PMOS region At shown in FIG. 2, a gate electrode 6 is formed by burying P-type poly-silicon in the groove made in the thickness direction of the substrate 1. Specifically, the conduction type of the gate electrode 6 of the trench PMOS is p-type. The explanation of the structure of the trench PMOS except for the gate electrode 6 will be described along with the manufacturing method.

Thus, in the present invention, the threshold voltage (Vth) is about 1 V shallower than the case of the N-type polysilicon because of the difference of the work functions in the case when P-type poly-silicon is applied to the gate electrode 6 of the trench PMOS. Thus, "on" resistance can be decreased in a state where the gate voltage is not sufficiently supplied. By applying P-type poly-silicon, the characteristic fluctuation increases compared with the case of N-type poly-silicon, but the advantage of decreasing the "on" resistance is great because it does not need the accuracy of the characteristics comparable to an offset PMOS.

On the other hand, in the protection circuit region Ac shown in FIG. 3, a gate electrode 10 composed of N-type poly-silicon is formed over the main face of the substrate 1 in the direction perpendicular to the thickness direction of the substrate 1. That is, the conduction type of the gate electrode 10 of the offset PMOS is N-type. This gate electrode is electrically connected to the gate interconnect G through the contact Cg. Moreover, the source and drain of the offset PMOS are electrically connected to the source interconnect S through the contact Cs and to the drain interconnect D through the contact Cd.

In the case when the N-type polysilicon is applied to the gate electrode of the offset PMOS as in the present invention, the characteristic fluctuation can be suppressed and malfunctions of the circuit can be prevented. The threshold voltage (Vth) becomes deeper by using N-type poly-silicon. However, for instance, in an MOS applied to an analogue circuit, it is necessary to set the effective channel length longer in order to suppress variations in the characteristics. However, when the effective channel length is maintained at, for instance, 4 μm or more, punch through does not occur and the threshold voltage (Vth) can be controlled on the shallow side even if an impurity layer which has a conduction type (P-type) opposite that of the channel layer (V-type layer) is formed over the channel surface.

Herein, the structure of the offset PMOS shown in FIG. 3 will be explained. This offset PMOS asymmetrically has a source region and a drain region opposite the gate electrode 10. Specifically, the drain region includes a P-type semiconductor region (first semiconductor region) 12 and a P+ semiconductor region (second semiconductor region) 14 and the source region includes a p+ type semiconductor region (second semiconductor region) 14, in which the impurity concentration of this P-type semiconductor region 12 is lower than the impurity concentration of the P+ type semiconductor region 14. Put another way, the offset PMOS has an LDD (Lightly doped drain) which is a low concentration region between the gate electrode 10 and the drain region. The high breakdown voltage can be maintained by controlling the impurity concentration in the LDD region and the length of the LDD region along the surface of the substrate 1.

The offset structure is a structure which maintains a high breakdown voltage at, for instance, a shallow region (semiconductor region) which is about several microns from the surface of the semiconductor substrate. The offset PMOS shown in the embodiment of the present invention is an offset drain structure where only the drain side has the offset structure and it is not one where both source and drain are offset such as a CMOS (Complementary Metal Oxide Semiconductor) of an LDD structure.

Figure 4:
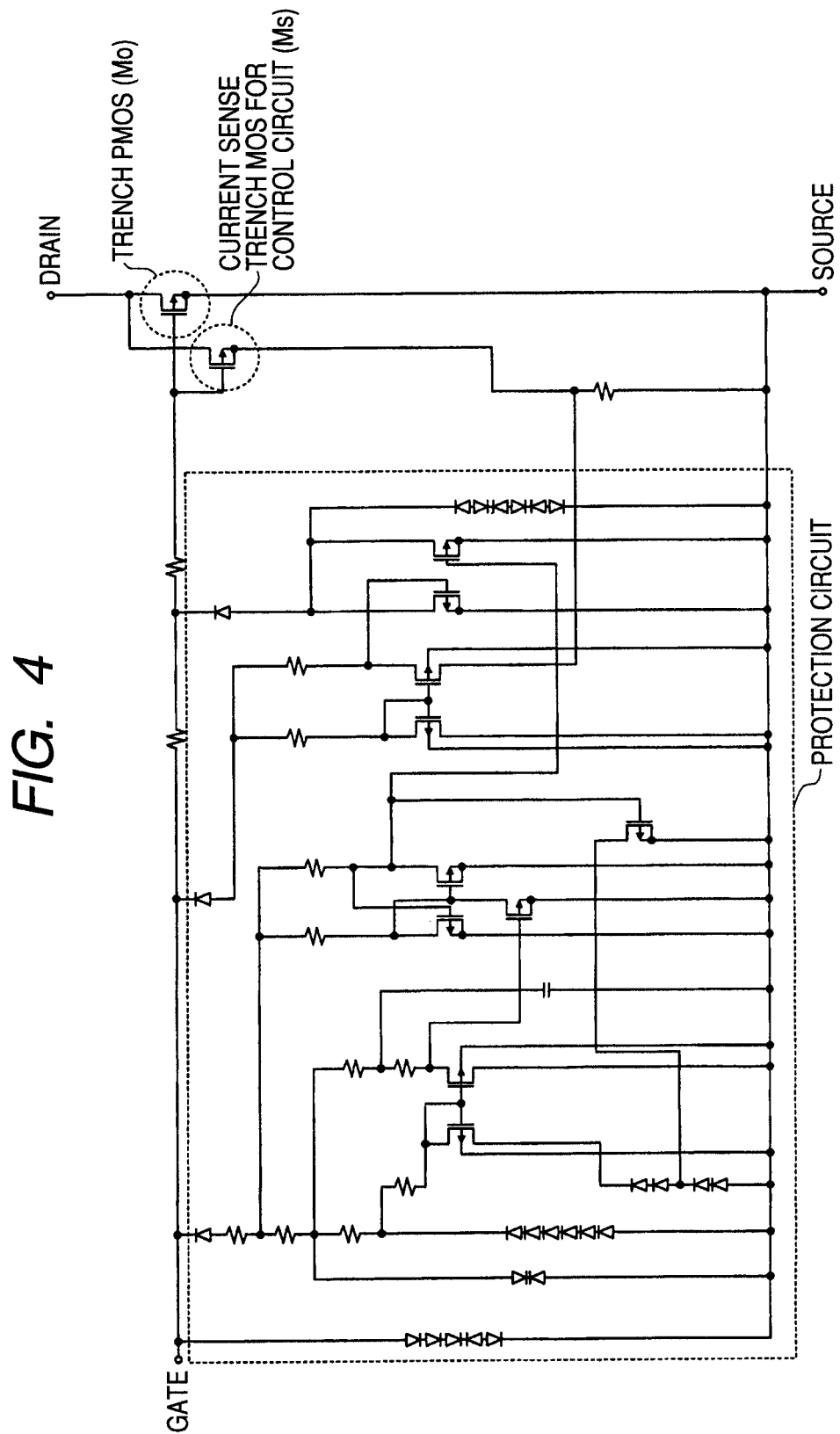
FIG. 4 is a circuit diagram from which a semiconductor device in the embodiment is configured.

Next, a circuit including semiconductor device of the embodiment is shown in FIG. 4. A protection circuit is electrically connected between the gate and source of the trench PMOS which is a power MOSFET (it is shown as Mo in FIG. 4). All of the MOSFETs formed in this protection circuit are offset PMOS. A semiconductor device of the embodiment includes a current sense trench MOS for a control circuit (it is shown as Ms in FIG. 4) besides a trench PMOS (it is shown as Mo in FIG. 4) and a protection circuit which are power MOSFETs.

As mentioned above, the protection circuit including the offset PMOS formed over the same substrate as the trench PMOS can prevent the semiconductor device from self-destruction by performing a circuit operation (overcurrent limit) so as not to let a current flow higher than a certain amount into the trench PMOS when a situation occurs in which an overcurrent flows to the trench PMOS. Moreover, the protection circuit of the overcurrent limit circuit controls the current flowing by the protection circuit in order to avoid the current breakdown when a large current flows into the device.

Moreover, the protection circuit detects a temperature of 150° C. or more and performs an operation where the input voltage from the gate is shut down (temperature detection overheat shutdown), thereby, a current flowing between the drain and source is self-shut down and self-destruction due to heat can be prevented. Specifically, when heat of 150° C. or more is generated by self-heating caused by power loss while a large current flows in the device, a built-in protection circuit works in the protection circuit of the temperature detection overheat shutdown circuit, resulting in the gate voltage of the trench PMOS being self-shut down.

Next, a manufacturing method of a semiconductor device of the present invention will be explained referring to FIGS. 5 to 16. FIGS. 5 to 16 are schematic explanatory drawings 19 illustrating cross-sections of a semiconductor device during manufacturing, in which a trench PMOS region At, an offset PMOS region Ac, and a border region Ac-At between the trench PMOS region At and the offset PMOS region Ac are shown.

Figure 5:
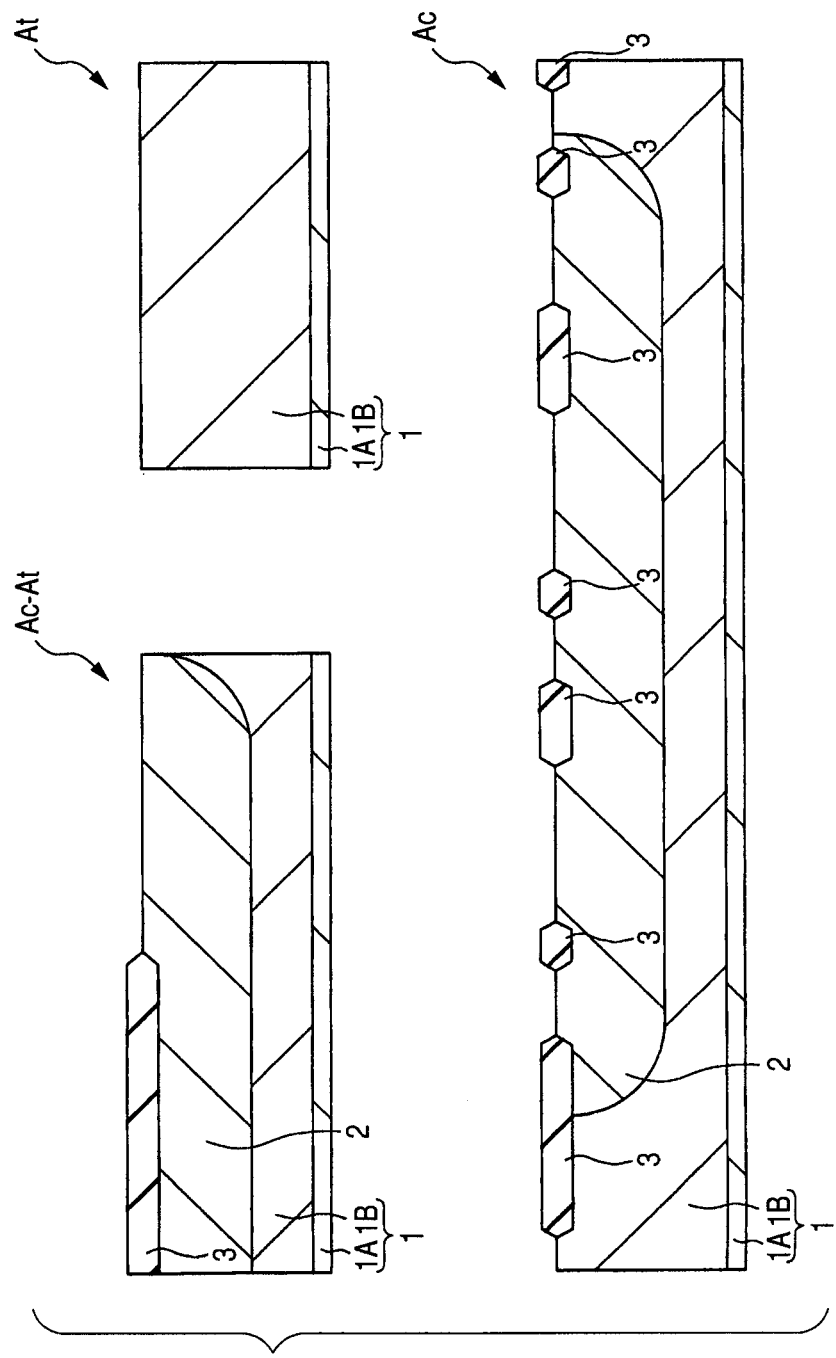
FIG. 5 is a main part cross-sectional drawing schematically illustrating a semiconductor device in a manufacturing process in the embodiment of the present invention.

First, as shown in FIG. 5, a semiconductor wafer to be a semiconductor substrate (hereinafter, it is simply called a substrate) 1 is ready, in which a p-type impurity doped p+ type single crystalline silicon layer 1B is epitaxially grown over the main face of the P++ type single crystalline silicon substrate 1A having P-type conduction type. Next, after the surface (main face) of the P+ type single crystalline silicon layer 1B is thermally oxidized, a silicon nitride film (which is not shown in the figure) is deposited over the entire surface of the substrate 1, N-type impurity ions are injected thereto by using a silicon nitride mask which was patterned for use as a selector by using photolithography and etching techniques, and an N-type well 2 is formed by thermal diffusion. Then, after the exposed surface of the substrate 1 is oxidized, the element separation part 3 is formed by removing the aforementioned silicon film.

Figure 6:
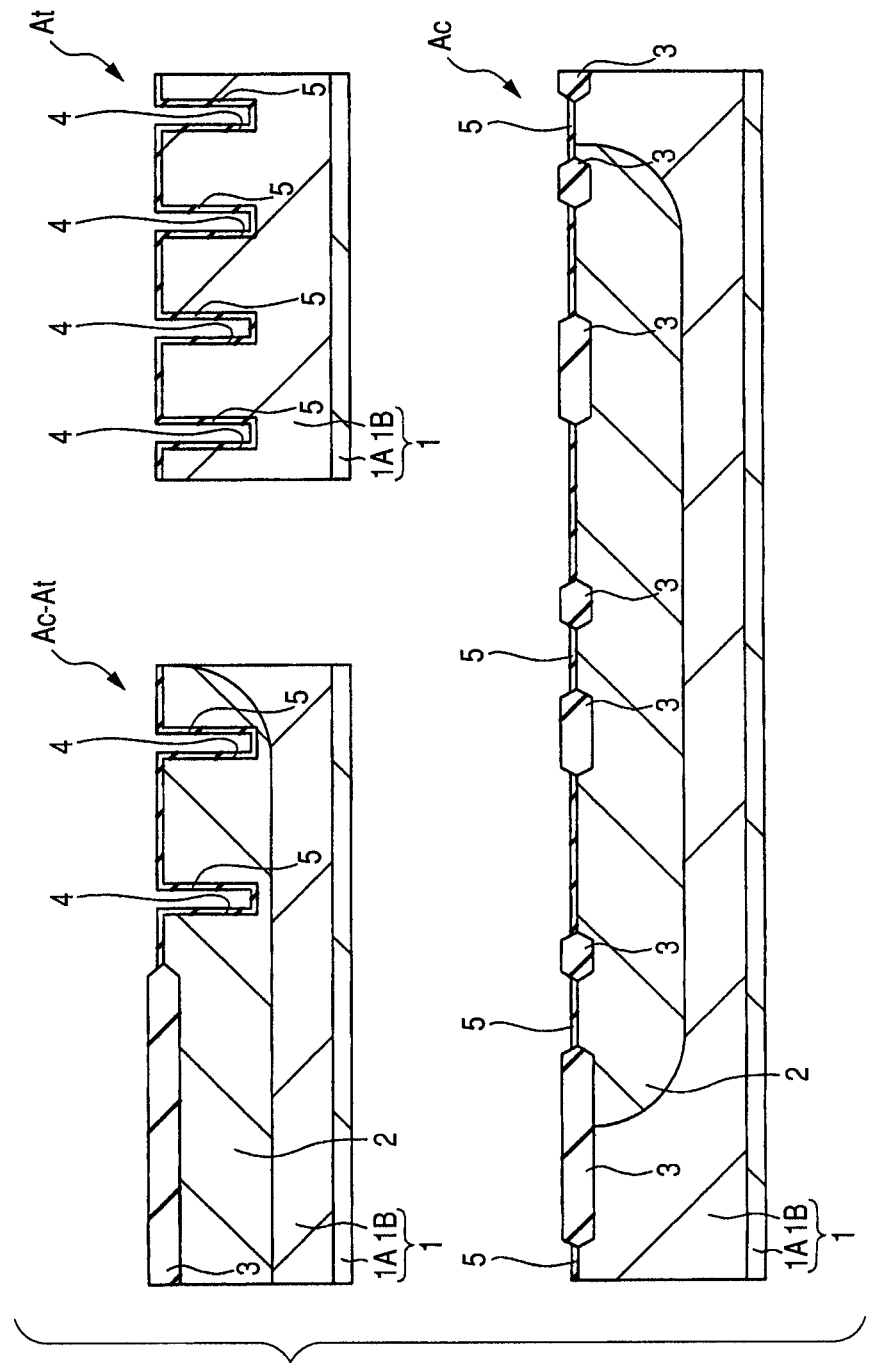
FIG. 6 is a main part cross-sectional drawing schematically illustrating a semiconductor device in a manufacturing process following FIG. 5.

As shown in FIG. 6, the substrate 1 is etched by using photolithography and etching techniques, the groove 4 is formed, and the silicon oxide film 5 is formed at the bottom part and the side walls of the groove 4 by applying heat treatment to the substrate 1. This silicon oxide film 5 becomes a gate insulator film of the trench PMOS.

Figure 7:
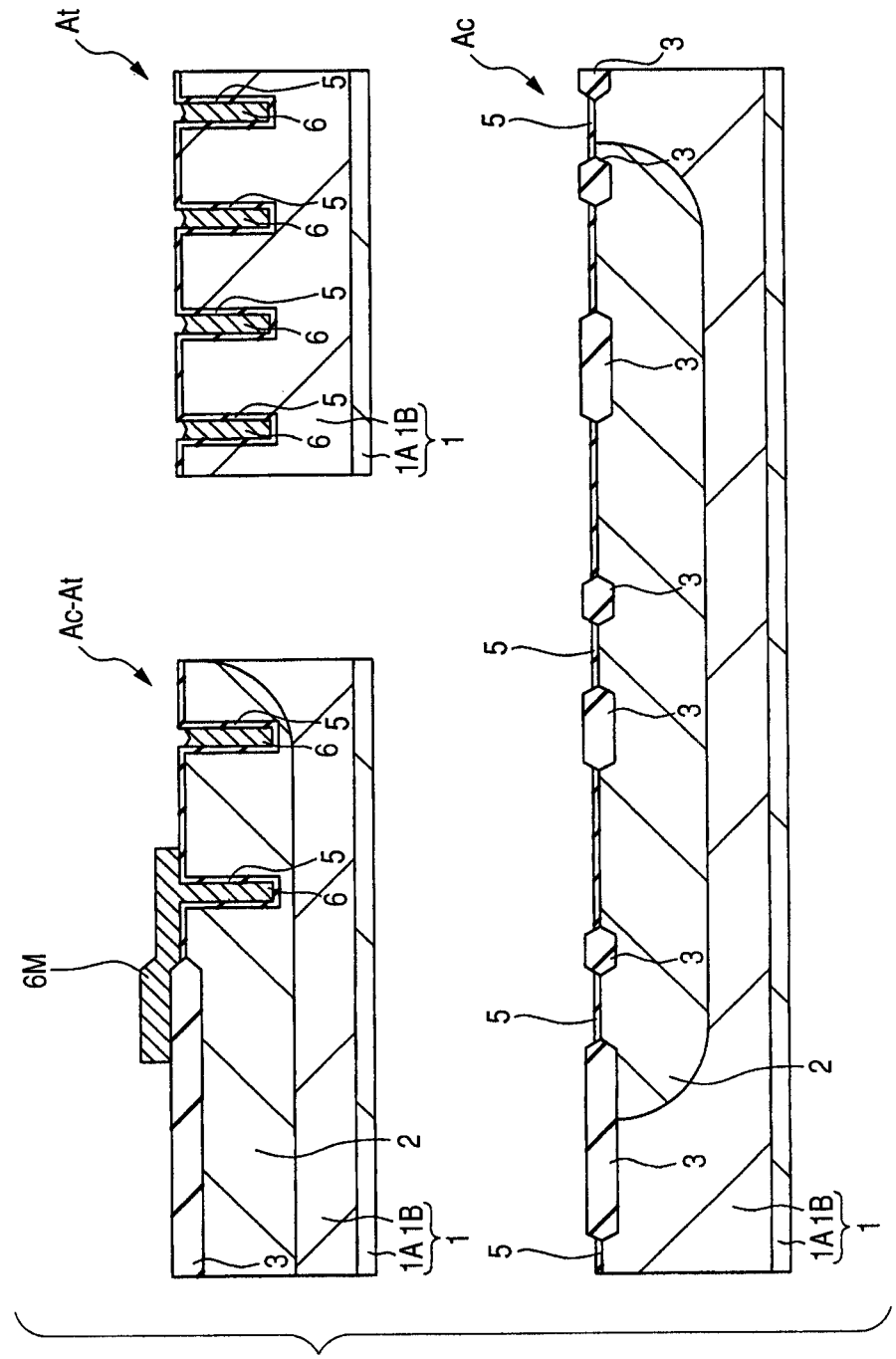
FIG. 7 is a main part cross-sectional drawing schematically illustrating a semiconductor device in a manufacturing process following FIG. 6.

As shown in FIG. 7, a P-type impurity (for instance, boron) doped polycrystalline silicon film is deposited over the silicon oxide film 5 which includes the inside of the groove 4 and fills the groove 4. Or, after non-doped polycrystalline silicon is deposited over the silicon oxide film 5, which includes the inside of the groove 4, to fill the groove 4, the polycrystalline silicon may be made P-type by injecting P-type impurity ions (for instance, boron) into the non-doped polycrystalline silicon. Next, the gate electrode 6 of the trench PMOS is formed in the groove 4 by leaving the polycrystalline silicon film in the groove 4 in the trench PMOS region At using the photoresist film patterned by using a photolithography technique as a mask. Moreover, in the border region Ac-At, the interconnect layer 6M which is electrically connected to the gate electrode 6 is formed.

Figure 8:
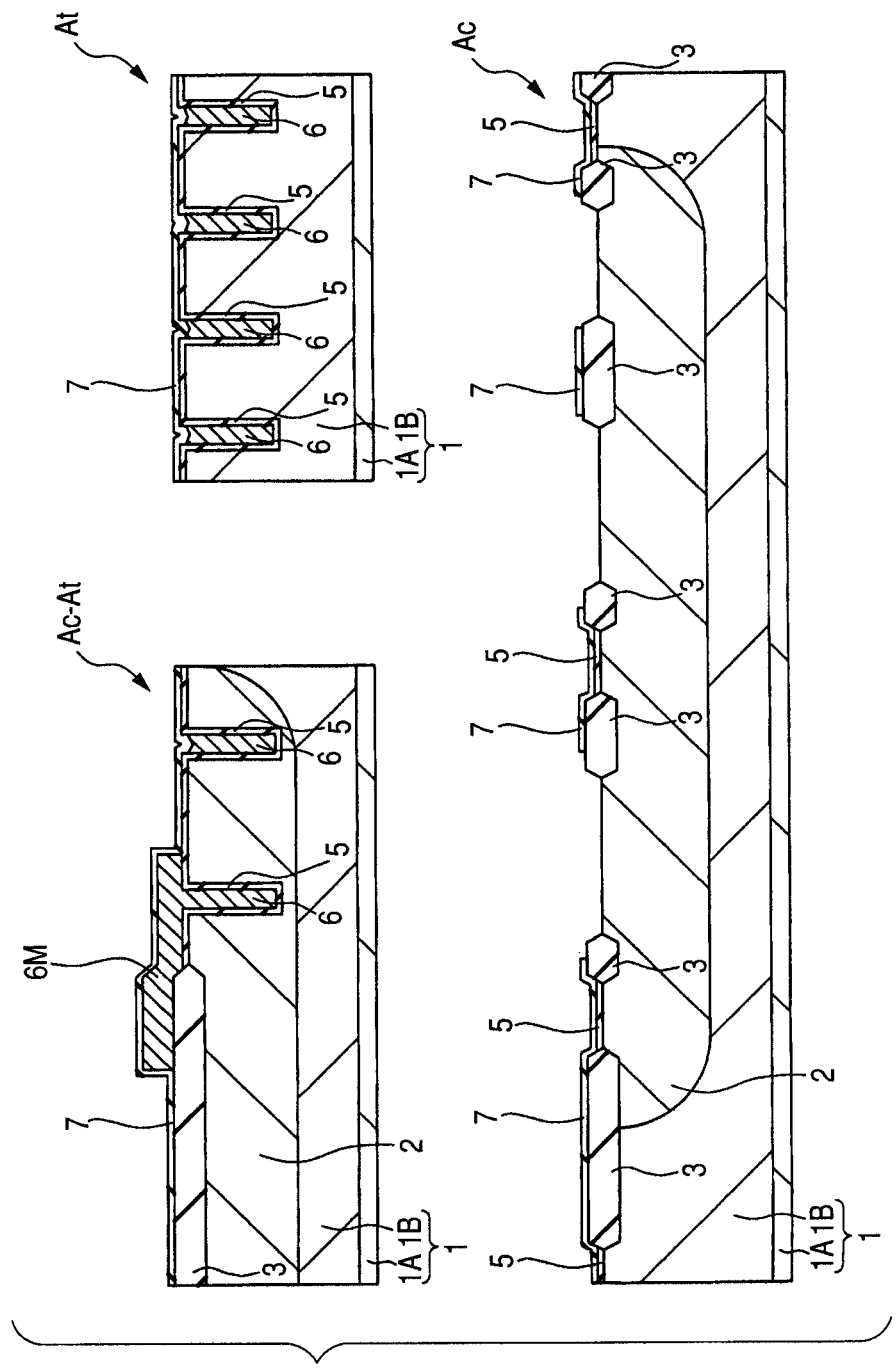
FIG. 8 is a main part cross-sectional drawing schematically illustrating a semiconductor device in a manufacturing process following FIG. 7.

As shown in FIG. 8, after depositing a silicon oxide film 7 over the main face of the substrate 1, the silicon oxide film 7 which will be a channel of the offset PMOS channel is opened by using photolithography and etching techniques and an implant layer (which is not shown in the figure) is formed by injecting ions for controlling the threshold voltage (Vth).

Figure 9:
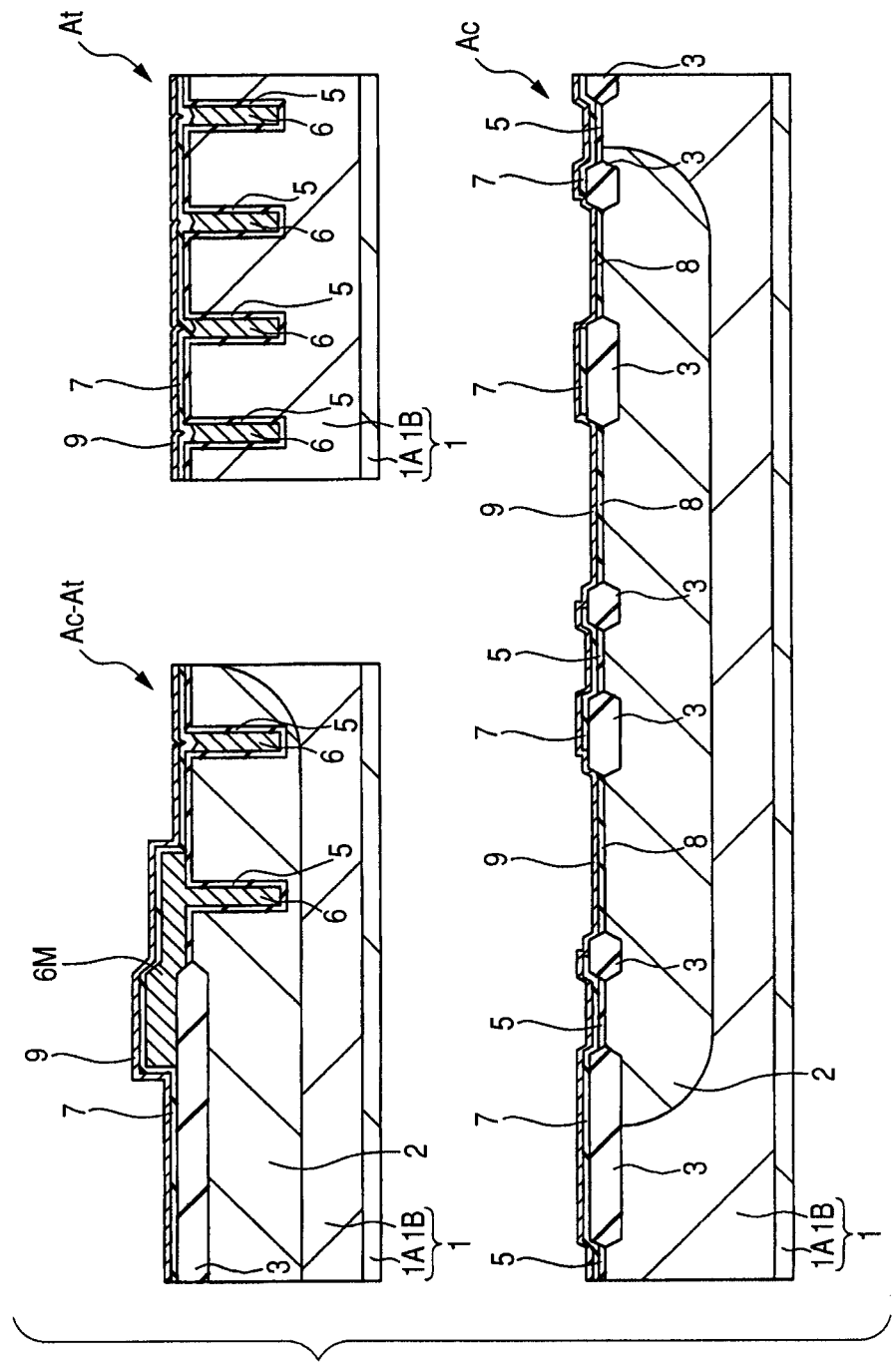
FIG. 9 is a main part cross-sectional drawing schematically illustrating a semiconductor device in a manufacturing process following FIG. 8.

As shown in FIG. 9, after a silicon oxide film 8 of the offset PMOS composed of a silicon oxide film is formed by using photolithography and etching techniques, an N-type impurity (for instance, arsenic or phosphorus) doped polycrystalline silicon film 9 is deposited' to cover the silicon oxide film 8. Or, the polycrystalline silicon film 9 may be made to be N-type by injecting N-type impurity (for instance, arsenic or phosphorus) after depositing a non-doped polycrystalline silicon film 9. After that, a silicon oxide film (which is not shown in the figure) is deposited over this polycrystalline silicon film 9.

Figure 10:
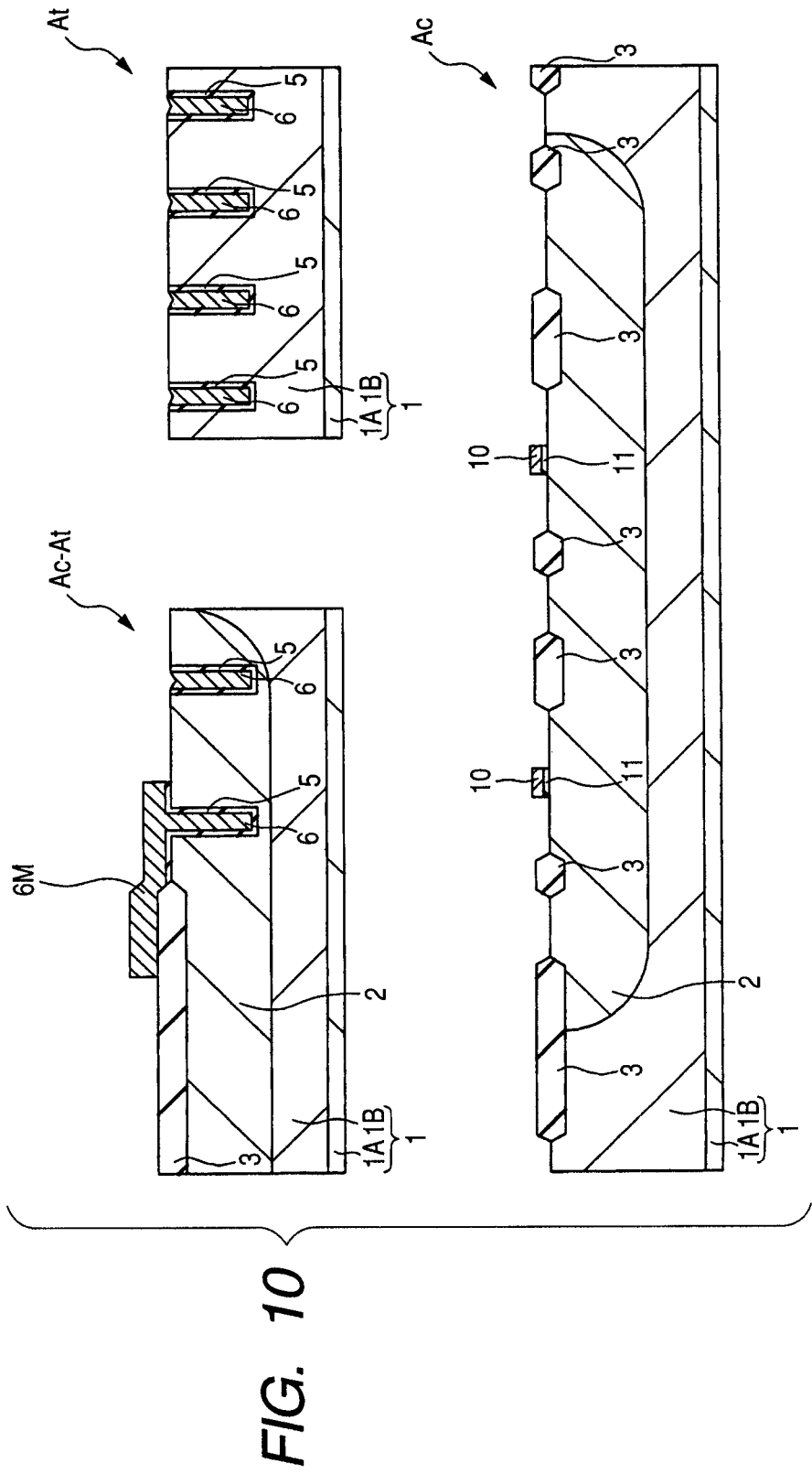
FIG. 10 is a main part cross-sectional drawing schematically illustrating a semiconductor device in a manufacturing process following FIG. 9.

As shown in FIG. 10, the polycrystalline silicon film 9 and the silicon oxide film 8 are removed by using photolithography and dry-etching techniques to form the gate electrode 10 and the gate insulator film 11 of the offset PMOS.

As mentioned above, in the present invention, the gate electrode 10 of the offset PMOS is manufactured in a separate step from the gate electrode 6 of the trench PMOS which has been previously formed. Moreover, the conduction type of the gate electrode 10 of the offset PMOS is formed to be N-type and the conduction type of the gate electrode 6 of the trench PMOS is formed to be p-type.

Figure 11:
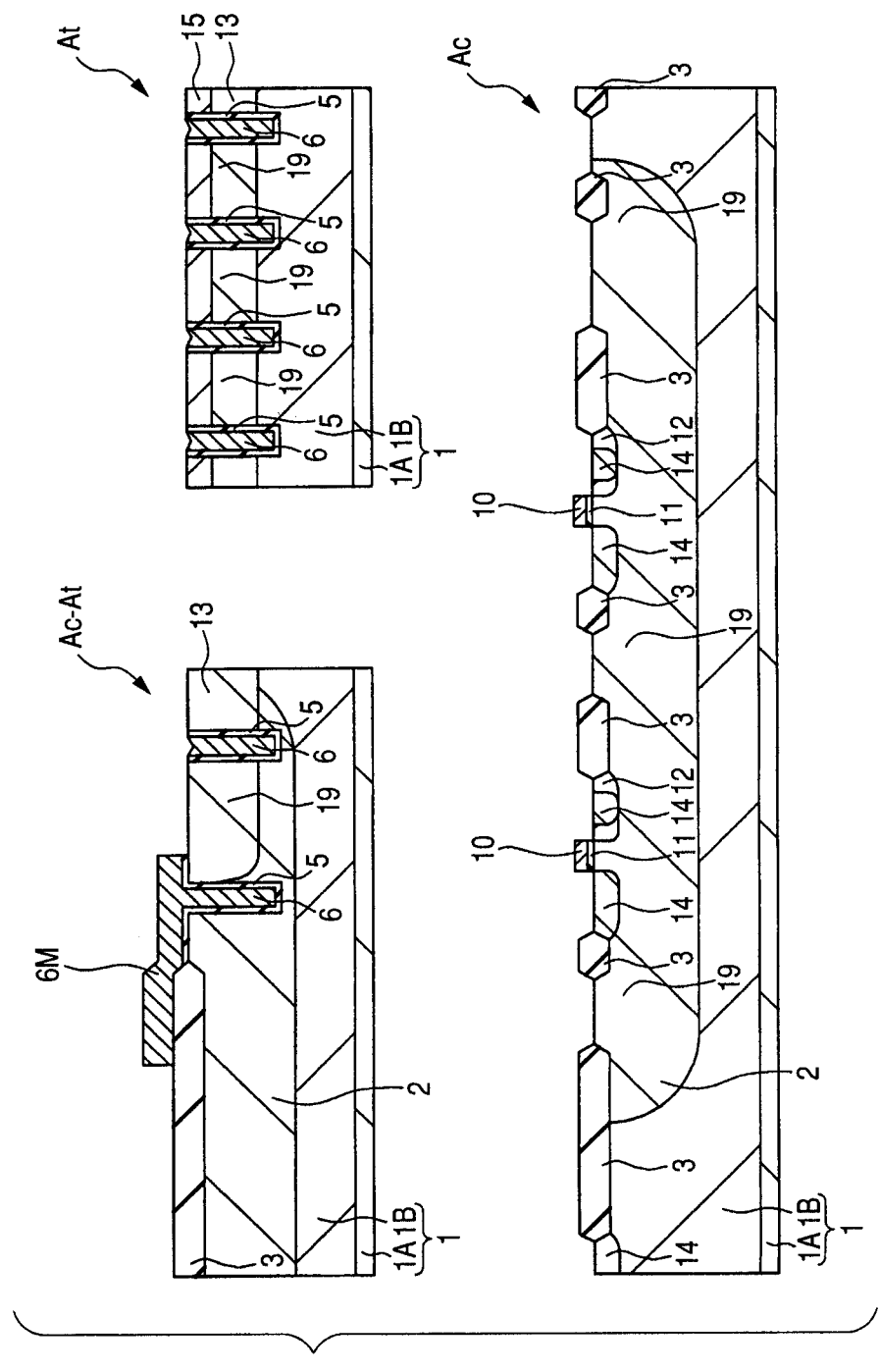
FIG. 11 is a main part cross-sectional drawing schematically illustrating a semiconductor device in a manufacturing process following FIG. 10.

As shown in FIG. 11, after removing the silicon oxide film 7 by using photolithography and dry-etching techniques, at the offset PMOS region Ac, P-type impurity ions are injected into the P+ type single crystalline silicon layer 1B using the photo-resist film (which is not shown in the figure) patterned by using a photolithography technique as a mask. Next, at the trench MOS region At, N-type impurity ions are injected into the p+ type single crystalline silicon layer 1B using the photo-resist film (which is not shown in the figure) patterned by using a photolithography technique as a mask. Then, those p-type and N-type impurity ions are allowed to diffuse respectively by applying a heat treatment to the substrate 1 to form the p-type semiconductor region 12 and the N-type semiconductor region 13. This N-type semiconductor region 13 will be a channel layer of the trench PMOS.

Then, impurity ions having P-type conduction type are introduced into the P+ type single crystalline silicon layer 1B using the photo-resist film (which is not shown in the figure) patterned by using a photolithography technique as a mask, thereby, a P+ type semiconductor region 14 which has a higher impurity concentration than the P− type semiconductor region 12 is formed in the offset PMOS region Ac. Moreover, impurity ions having P-type conduction type are introduced into the P+ type single crystalline silicon layer 1B using the photo-resist film (which is not shown in the figure) patterned by using a photolithography technique as a mask, thereby, the P+ type semiconductor region 15 is formed in the trench PMOS region At. According to the steps described above, a trench PMOS can be applied, in which the P++ type single crystalline silicon substrate 1A and the P+ type single crystalline silicon layer 1B are used for the drain and the N-type semiconductor region 13 is used for the source. Moreover, the P+ type semiconductor region 15 can be used for a punch through stopper layer in the trench MOS.

As mentioned above, in the present invention, a P− type semiconductor region 12 which has a lower impurity concentration than the P+ type semiconductor layer 14 is formed between the P+ type semiconductor region 14 and the gate electrode 10 to be an offset drain structure, which maintains a high breakdown voltage at, for instance, a shallow region which is about several microns from the surface of the semiconductor substrate 1.

Figure 12:
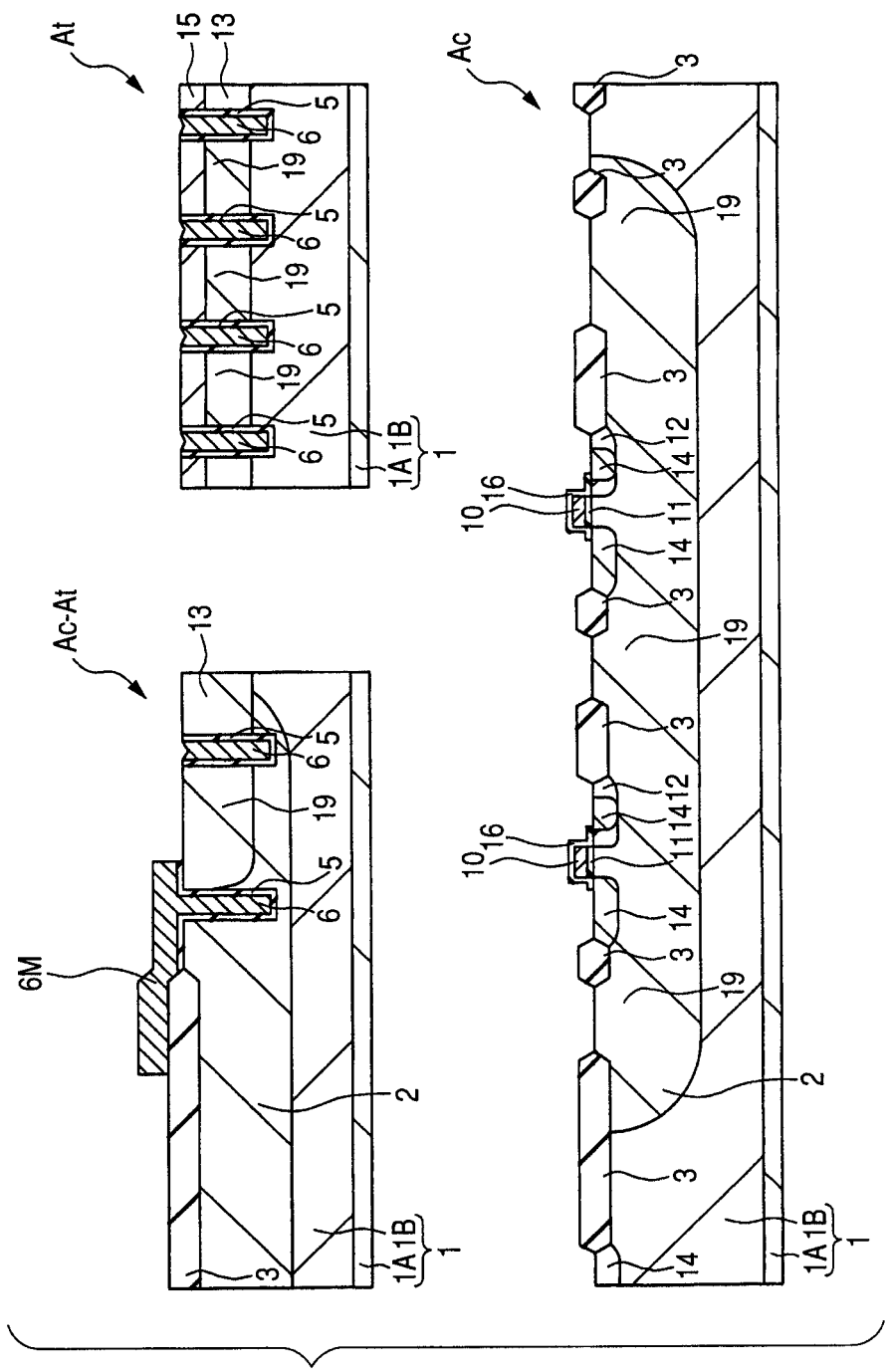
FIG. 12 is a main part cross-sectional drawing schematically illustrating a semiconductor device in a manufacturing process following FIG. 11.

As shown in FIG. 12, after depositing a silicon oxide film over the substrate 1, a silicon nitride film is deposited over the silicon oxide film and an insulator film 16 including the silicon oxide film and the silicon nitride film is formed by using photolithography and etching techniques.

Figure 13:
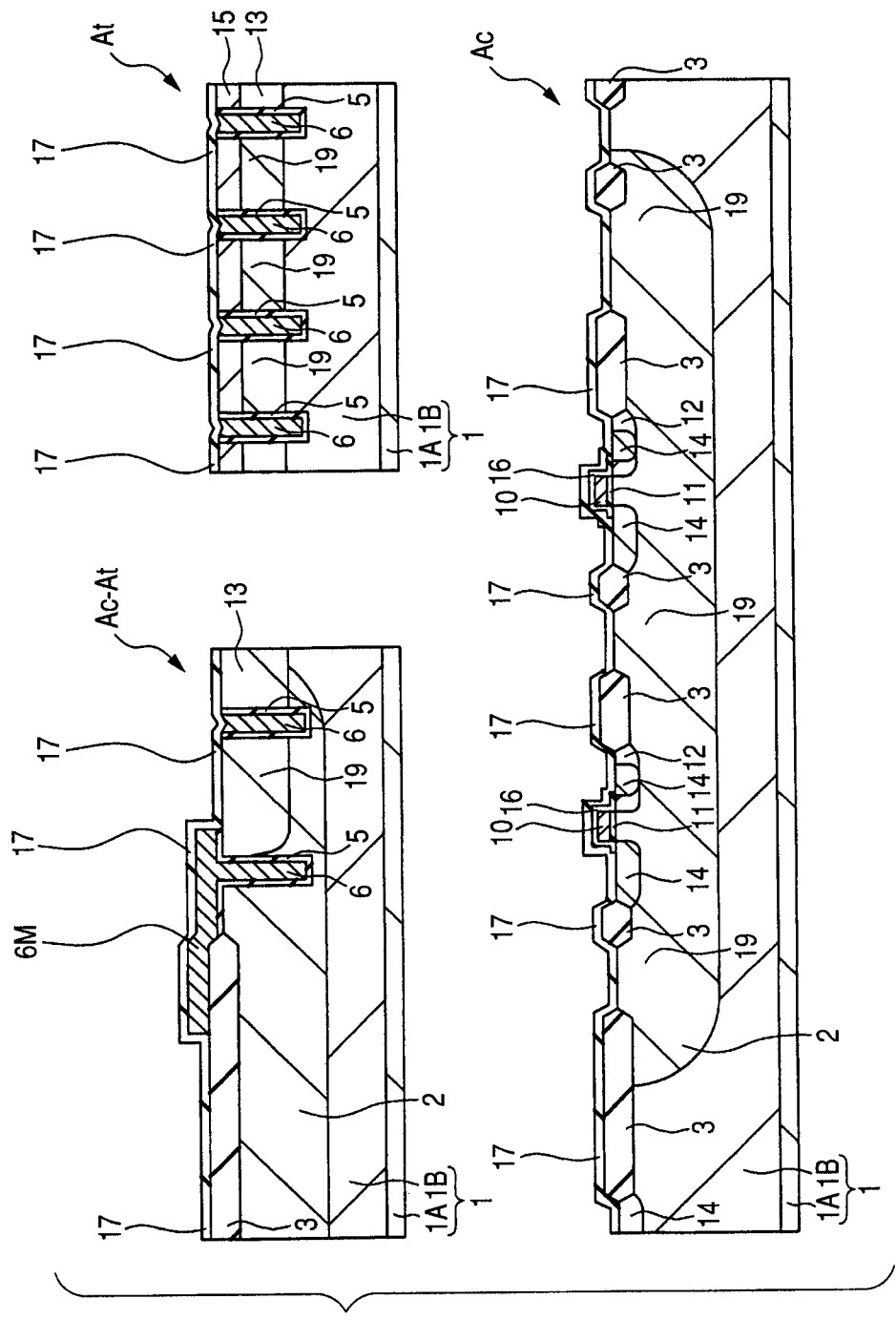
FIG. 13 is a main part cross-sectional drawing schematically illustrating a semiconductor device in a manufacturing process following FIG. 12.

As shown in FIG. 13, after depositing a PSG (Phospho Silicate Glass) film over the substrate 1, an SOG (Spin On Glass) film is coated over the PSG film, resulting in an insulator film 17 being formed including the PSG film and the SOG film.

Figure 14:
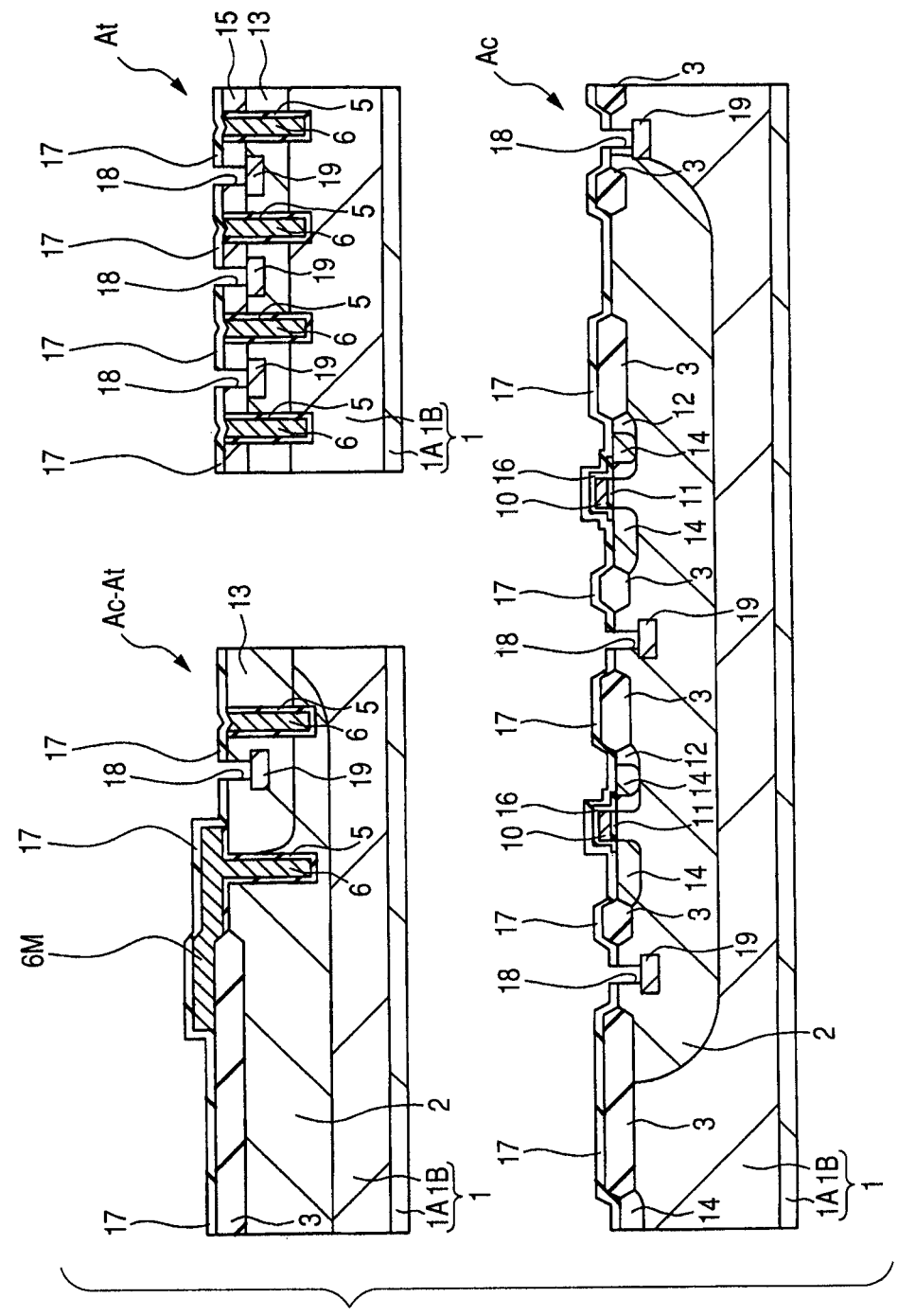
FIG. 14 is a main part cross-sectional drawing schematically illustrating a semiconductor device in a manufacturing process following FIG. 13.

As shown in FIG. 14, after the insulator film 17 and the substrate 1 are etched using a photo-resist film (which is not shown in the figure) patterned by using a photolithography technique as a mask, a contact groove 18 is formed by removing the photo-resist film. This contact groove 18 is formed so as to penetrate through the P+ type semiconductor region 15 which will be a source of the trench PMOS between the adjoining gate electrodes 6.

By introducing N-type impurity ions from the bottom of the contact groove 18, an N+ type semiconductor region 19 is formed at the bottom of the contact groove 18. Thus, by forming the contact groove 18, introducing impurity ions from the contact groove 18 using the insulator film 17 as a mask, and providing the N+ type semiconductor region 19 self-epitaxially at the bottom of the contact groove 18, the gap between the adjoining gate electrodes 6 can be made finer because, for instance, the mask adjustment margin can be decreased. This N+ type semiconductor region 19 is one for making ohmic contact with the interconnect layer 21 formed in the following step with the N-type semiconductor region 13 at the bottom of the contact groove 18.

Figure 15:
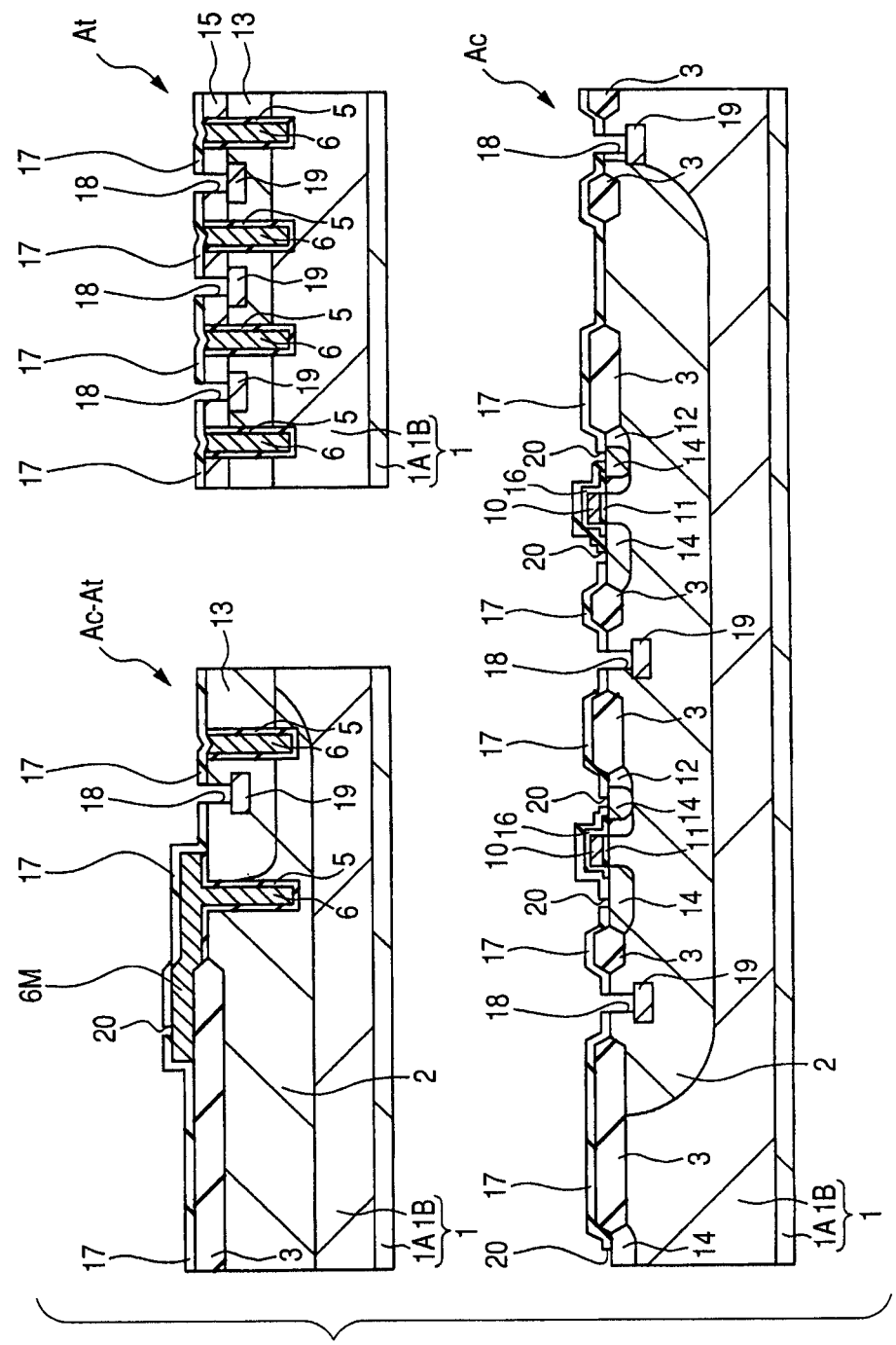
FIG. 15 is a main part cross-sectional drawing schematically illustrating a semiconductor device in a manufacturing process following FIG. 14.

As shown in FIG. 15, a contact groove 20 is formed by etching the insulator film 17 using a photo-resist film (which is not shown in the figure) patterned by using a photolithography technique as a mask, and removing the photo-resist film. This contact groove 20 is formed so as to expose the surface of the P+ type semiconductor region 14 at the offset PMOS region Ac. Moreover, at the border region Ac-At, this contact groove 20 is formed so as to expose the surface of the interconnect layer 6M which is electrically connected to the gate electrode 6.

Figure 16:
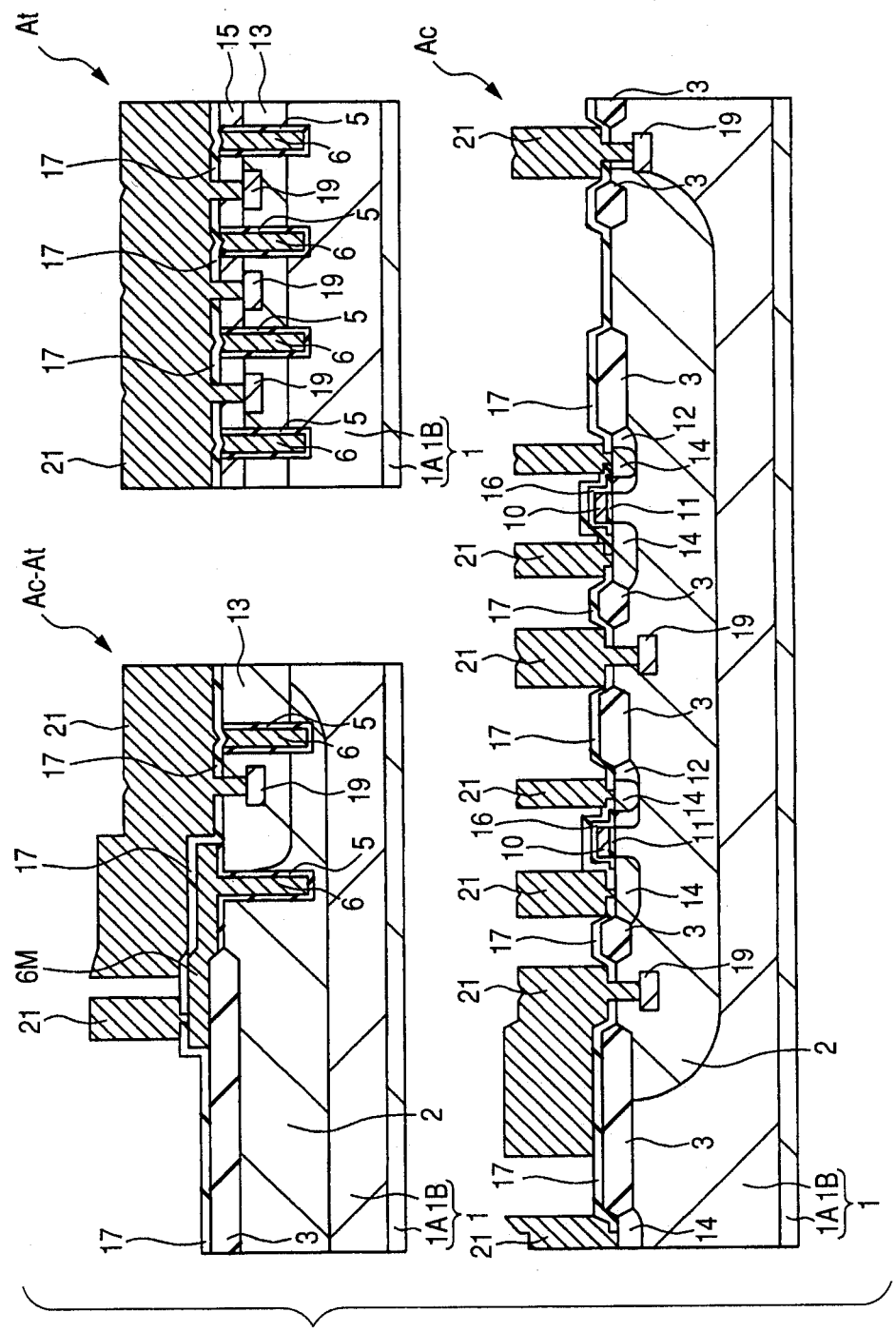
FIG. 16 is a main part cross-sectional drawing schematically illustrating a semiconductor device in a manufacturing process following FIG. 15.
Figure 17:
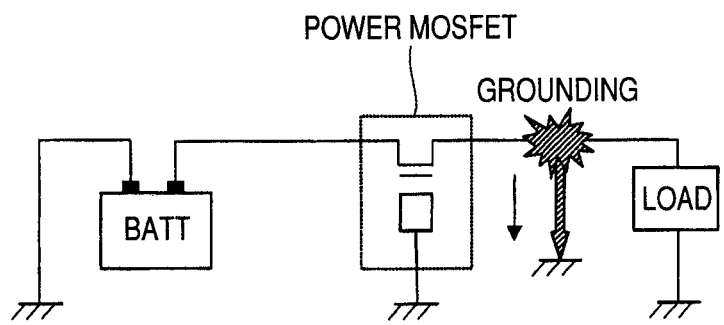
FIG. 17 is a circuit drawing of a high side switch circuit where a power MOSFET is applied.
Figure 18:
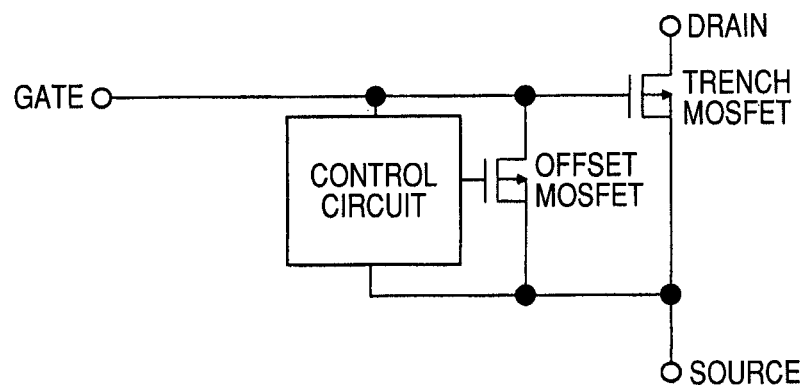
FIG. 18 is a circuit drawing illustrating a power MOSFET with a built-in protection circuit.
Figure 19A:
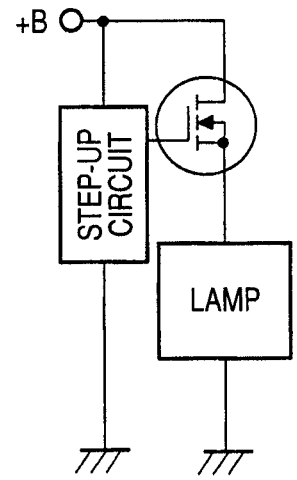
Figure 19B:
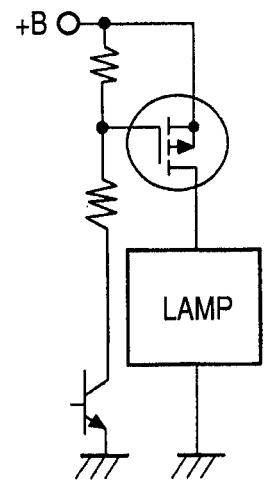
Figure 20A:
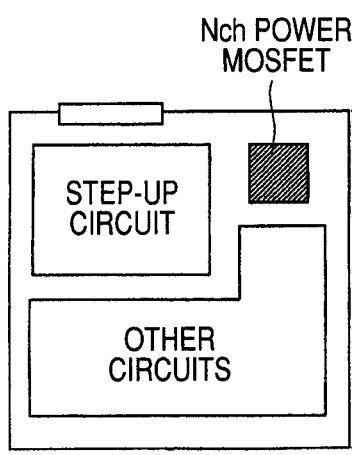
Figure 20B:
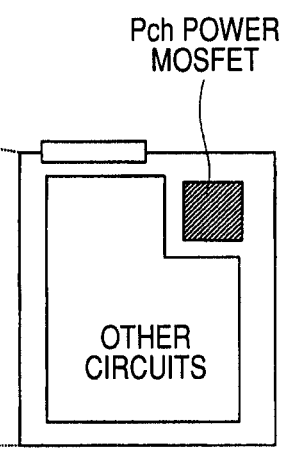

Next, as shown in FIG. 16, after a film composed of TiW (tungsten titanium) (which is not shown in the figure) is thinly deposited as a barrier conductor film by using, for instance, a sputtering technique over the upper surface of the insulator film 17 which includes the inside of the contact grooves 18 and 20, a heat treatment is applied to the substrate 1. After a conductive film composed of Al (aluminum) having a lower resistivity than the polycrystalline silicon film which forms the gate electrode 6 is deposited over the TiW film by using a sputtering technique, an interconnect layer 21 composed of Al is formed by using photolithography and etching techniques. The conductive film is a film mainly composed of Al and, for instance, Si (silicon) and Cu (copper) may also be included. Moreover, the barrier conductor film plays a role in preventing an undesired reaction layer from being formed by contacting Al with the substrate 1.

After depositing the protection film (which is not shown in the figure) to cover the insulator film 17 and the interconnect layer 21, the surface of the interconnect layer which will be a surface electrode (electrode pad) is exposed by removing the protection film at the predetermined area on the interconnect layer 21 by using photolithography and etching techniques. After that, by depositing the rear electrode (which is not shown in the figure) at the rear face of the substrate 1, a semiconductor device including a trench PMOS with a built-in protection circuit (offset PMOS) is almost completed.

As mentioned above, in this embodiment, the gate electrode 6 of the trench PMOS and the gate electrode 10 of the offset PMOS are formed in separate steps and the trench PMOS and the offset PMOS are formed over the main face of the same substrate. At this time, after the gate electrode 6 of the trench PMOS is formed of boron (B) doped P-type polycrystalline silicon, the gate electrode 10 of the offset PMOS is formed of arsenic (As) or phosphorus (P) doped N-type polycrystalline silicon. As a result, the threshold voltage (Vth) fluctuation of the offset PMOS constituting the protection circuit can be controlled without an increase in the threshold voltage (Vth) of the trench PMOS.

The invention developed by the inventors was concretely described on the basis of the embodiments, however it is to be understood that the invention is not intended to be limited to the specific embodiments, and variations may be made by one skilled in the art without departing from the spirit and scope of the invention.

For instance, in the aforementioned embodiment, as steps for forming the P-type gate electrode of the trench PMOS and N-type gate electrode of offset PMOS are formed, a case was described in which the polycrystalline silicon to be the gate electrode of the offset MOSFET was formed after forming the polycrystalline silicon to be the gate electrode of the trench PMOS (polycrystalline silicon 2-layer process). On the other hand, the polycrystalline silicon to be the gate electrode of the trench PMOS and the offset PMOS may be formed simultaneously (polycrystalline silicon 1-layer process). For instance, gate insulator films of the trench PMOS and the offset PMOS are formed independently and, at the same time, non-doped polycrystalline silicon is deposited over these gate insulator films. After that, the polycrystalline silicon at the trench MOS formation region is made to be P-type by injecting boron ions, and the polycrystalline silicon at the offset PMOS formation region is made to be N-type by injecting phosphorus ions. According to this, the threshold voltage (Vth) fluctuation of the offset PMOS constituting the protection circuit can be controlled without an increase in the threshold voltage (Vth) of the trench PMOS.

The present invention is widely used in manufacturing businesses which produce semiconductor devices.

The invention claimed is:

1. A semiconductor device for use in an automobile, including:
a semiconductor substrate;
a P-channel trench gate MOSFET having a gate electrode, a source and a drain, disposed over a main surface of the semiconductor substrate; and
a protection circuit coupled to the gate electrode of the P-channel trench gate MOSFET,
the protection circuit comprising a P-channel planar gate MOSFET disposed over the main surface of the semiconductor substrate,
wherein a conduction type of the gate electrode of the P-channel trench gate MOSFET is P-type,
wherein a conduction type of a gate electrode of the P-channel planar gate MOSFET is n-type,
wherein the source of the P-channel trench gate MOSFET is coupled to a battery in the automobile,
wherein the drain of the P-channel trench gate MOSFET is coupled to a load in the automobile,
wherein the load is coupled to a ground terminal in the automobile.

2. The semiconductor device according to claim 1, wherein the P-channel planar gate MOSFET has an offset drain structure.

3. The semiconductor device according to claim 1, wherein the protection circuit is a temperature detection overheat cutoff circuit.

4. The semiconductor device according to claim 1, wherein the protection circuit is an over-current limit circuit.

5. A semiconductor device comprising:
a semiconductor substrate;
a P-channel trench gate MOSFET disposed over a main surface of the semiconductor substrate and having a gate electrode, a source and a drain, the gate electrode of the P-channel trench gate MOSFET is P-type polycrystalline silicon; and
a protection circuit coupled to the gate electrode of the P-channel trench gate MOSFET and disposed over the main surface of the semiconductor substrate, the protection circuit including a P-channel planar gate MOSFET whose gate electrode is N-type polycrystalline silicon.

6. The semiconductor device according to claim 5, wherein the P-channel planar gate MOSFET has an offset drain structure.

7. The semiconductor device according to claim 5, wherein the protection circuit includes a temperature detection overheat cutoff circuit or an over-current limit circuit.

8. The semiconductor device according to claim 5, wherein the P-type polycrystalline silicon is doped with boron (B), and
wherein the N-type polycrystalline silicon is doped with arsenic (As) or phosphorus (P).

9. A semiconductor device comprising:
a gate terminal;
a source terminal;
a drain terminal;
a semiconductor substrate;
a P-channel trench gate MOSFET disposed over a main surface of the semiconductor substrate and having a gate electrode coupled to the gate terminal, a source coupled to the source terminal and a drain coupled to the drain terminal, the gate electrode of the P-channel trench gate MOSFET is P-type polycrystalline silicon; and
a protection circuit disposed over the main surface of the semiconductor substrate and coupled between the gate terminal and the source terminal, the protection circuit including a P-channel planar gate MOSFET having a gate electrode of N-type polycrystalline silicon.

10. The semiconductor device according to claim 9, wherein the P-channel planar gate MOSFET has an offset drain structure.

11. The semiconductor device according to claim 9, wherein the protection circuit includes a temperature detection overheat cutoff circuit or an over-current limit circuit.

12. The semiconductor device according to claim 9, wherein the P-type polycrystalline silicon includes boron (B), and
wherein the N-type polycrystalline silicon includes arsenic (As) or phosphorus (P).

13. A semiconductor device comprising:
a gate terminal;
a source terminal;
a drain terminal;
a semiconductor substrate;
a P-channel trench gate MOSFET disposed over a main surface of the semiconductor substrate and having a gate electrode coupled to the gate terminal, a source coupled to the source terminal and a drain coupled to the drain terminal, the gate electrode of the P-channel trench gate MOSFET is boron (B) doped P-type polycrystalline silicon; and
a protection circuit for a temperature detection overheat cutoff circuit or an over-current limit circuit, the protection circuit being disposed over the main surface of the semiconductor substrate and coupled between the gate terminal and the source terminal, the protection circuit including a P-channel planar gate MOSFET with an offset drain structure having a gate electrode of arsenic (As) or phosphorus (P) doped N-type polycrystalline silicon.

* * * * *